United States Patent [19]
Bogdan

[11] Patent Number: 5,910,753
[45] Date of Patent: Jun. 8, 1999

[54] DIRECT DIGITAL PHASE SYNTHESIS

[75] Inventor: Wladyslaw Bogdan, Ottawa, Canada

[73] Assignee: Northern Telecom Limited, Montreal, Canada

[21] Appl. No.: 08/933,876

[22] Filed: Sep. 19, 1997

[51] Int. Cl.$^6$ .............................. H03L 7/08; H03L 7/087
[52] U.S. Cl. ............................... 331/17; 331/11; 331/14; 331/18; 331/25; 327/156; 375/376
[58] Field of Search .................................. 331/1 A, 4, 11, 331/14, 17, 18, 23, 25, DIG. 2; 327/156–159; 375/344, 376

[56] References Cited

U.S. PATENT DOCUMENTS 5,670,913  9/1997  Garcia .......................................... 331/4

OTHER PUBLICATIONS

Hartmann, Harro L. and Steiner, Erhard, "Synchronization Techniques For Digital Networks," IEEE Journal on Selected Areas in Communications, vol. SAC–4 No. 4 (Jul. 1986) pp. 506–513.

Goldsztein, Guillermo and Strogatz, Steven H., "Stability of Synchronization in Networks of Digital Phase–Locked Loops," International Journal of Bifurcation and Chaos, vol. 5, No. 4 (1995) pp. 983–990.

Kwan, Tom, Adams Robert, and Libert Robert, "A Stereo Multibit ΣΔ DAC With Asynchronous Master–Clock Interface," IEEE Journal of Solid–State Circuits, vol. 31, No. 12, (Dec. 1998) pp. 1881–1887.

Abeysekera, Saman S., "Optimum Stuff Threshold Modulation Schemes for Digital Transmission," Proceedings of ICASSP '94, IEEE International Conference on Acoustics, Speech and Signal Processing, vol. IV, pp. 169–172, (Apr. 1994).

Luan, Saihua and Mari, Shinsaku, "Delay and Jitter Property of Mutally Synchronized Network Using the Complete Digital PLLs," IEEE Pacific Rim Conference on Communications, Computers, and Signal Processing, (Jun. 4–5, 1987) pp. 213–216.

"Implementation of a New Type of PLL Using High Performance DSP DSSP–1", S. Ono et al., IEEE/IECEJ/ASJ International Conference of Acoustics, Speech and Signal Processing, 1986, pp. 2195–2198.

*Primary Examiner*—David Mis
*Attorney, Agent, or Firm*—Aprilia U. Diaconescu

[57] ABSTRACT

A universal synchronizer for use in a variety of telecommunications systems based on direct digital phase synthesis (DDPS) include digital and analog PLLs. The synchronizer may be used for wireless, optical, or wireline transmission systems and for a wide ranges of data rates. Digital phase detectors are used in the digital PLLs for comparing the phase of the local clock $f_L$ with the phase of a respective digital reference clock, and provides a respective phase error signal. A digital phase synthesis unit receives the phase error signal and a target phase error and produces a first and a second set of control signals for driving an error driver. The error driver generates the control voltage for adjusting the frequency of a VCXO that is used for all PLLs, to lock the respective PLL. The first set of control signal generates the control voltage for the digital PLLs, and the second set of control signals generates the control voltage for the analog PLLs and for the acquisition mode of operation of all PLLs. The frequency and the width of the members of the first and second set of control signals are adjusted with a density width code, which is calculated for a target value and for the specific configuration of the synchronizer.

22 Claims, 9 Drawing Sheets

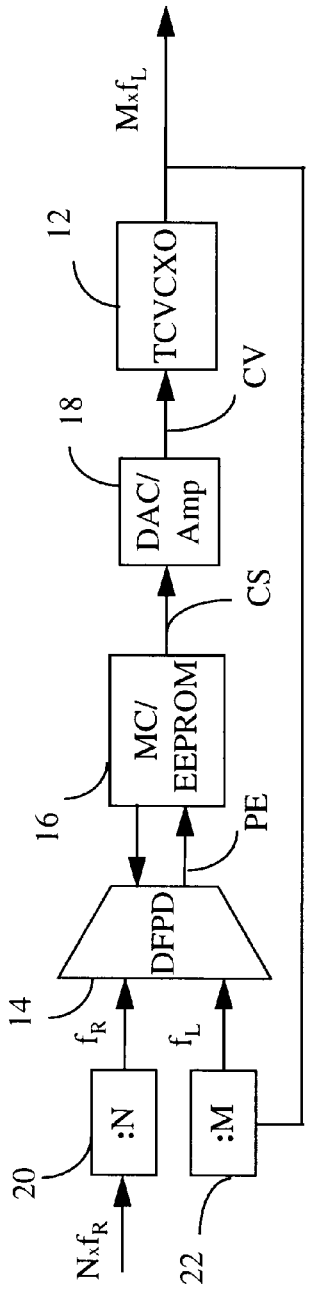
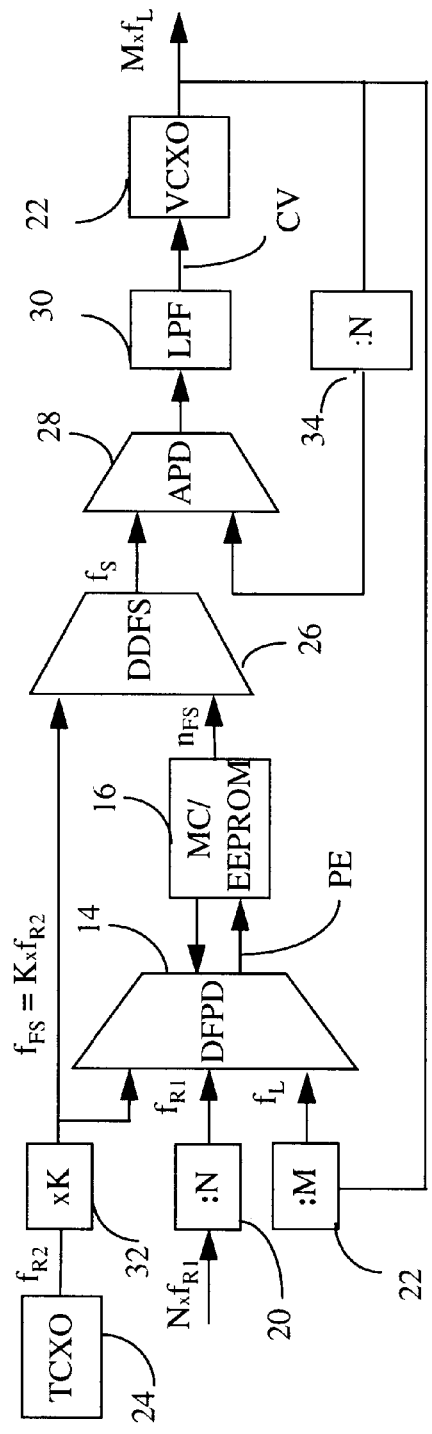
FIGURE 1A (Prior Art)
FIGURE 1B (Prior Art)

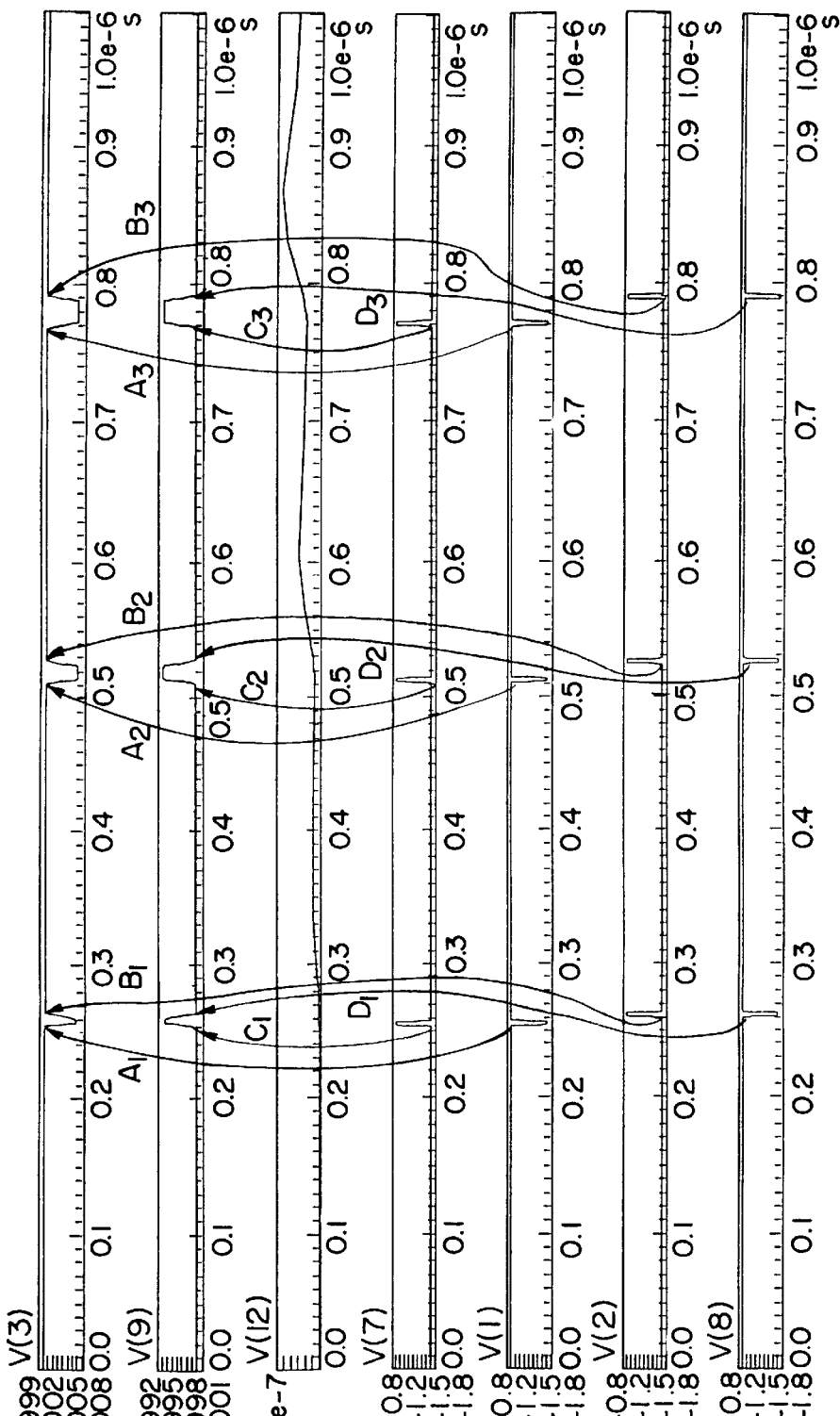

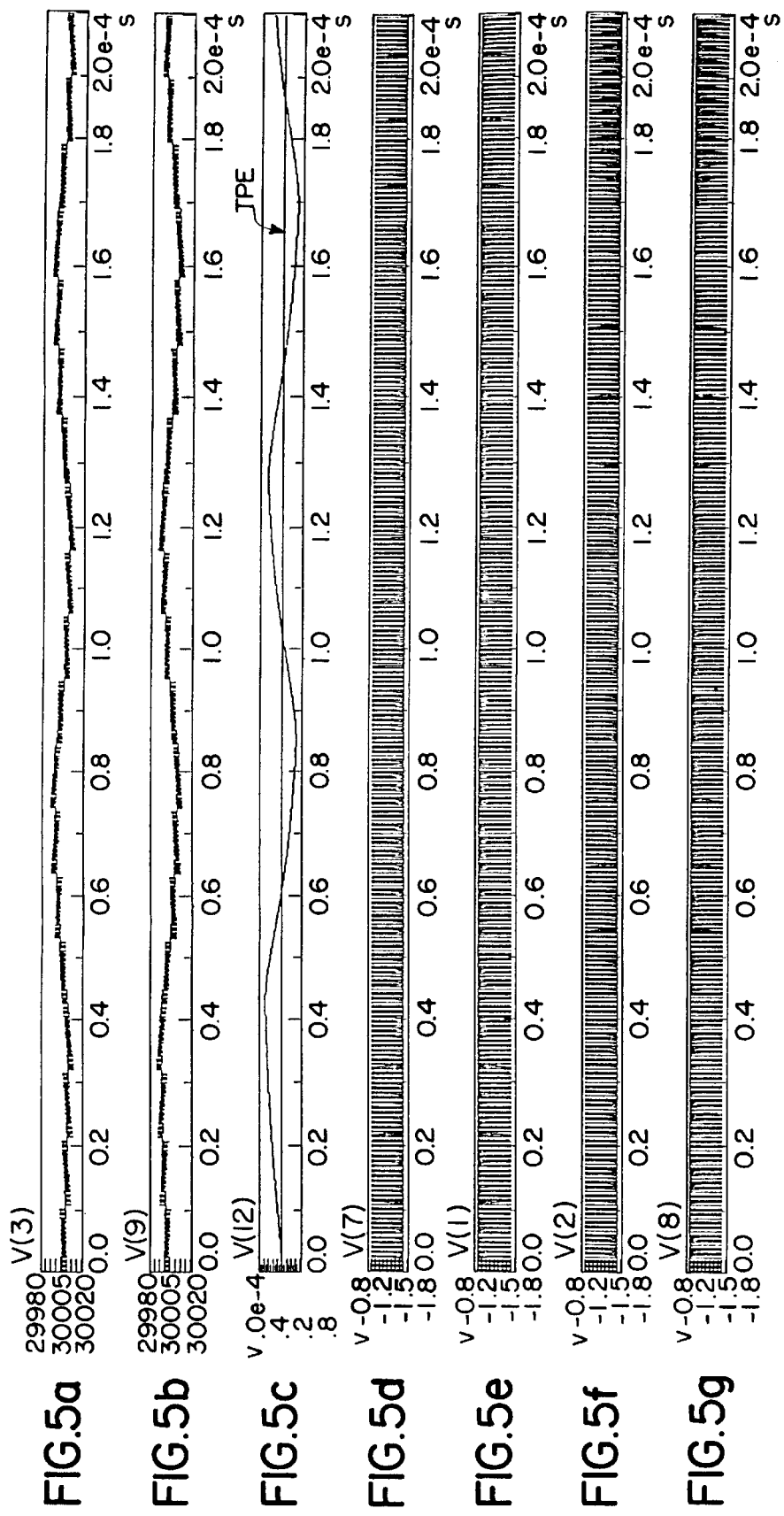

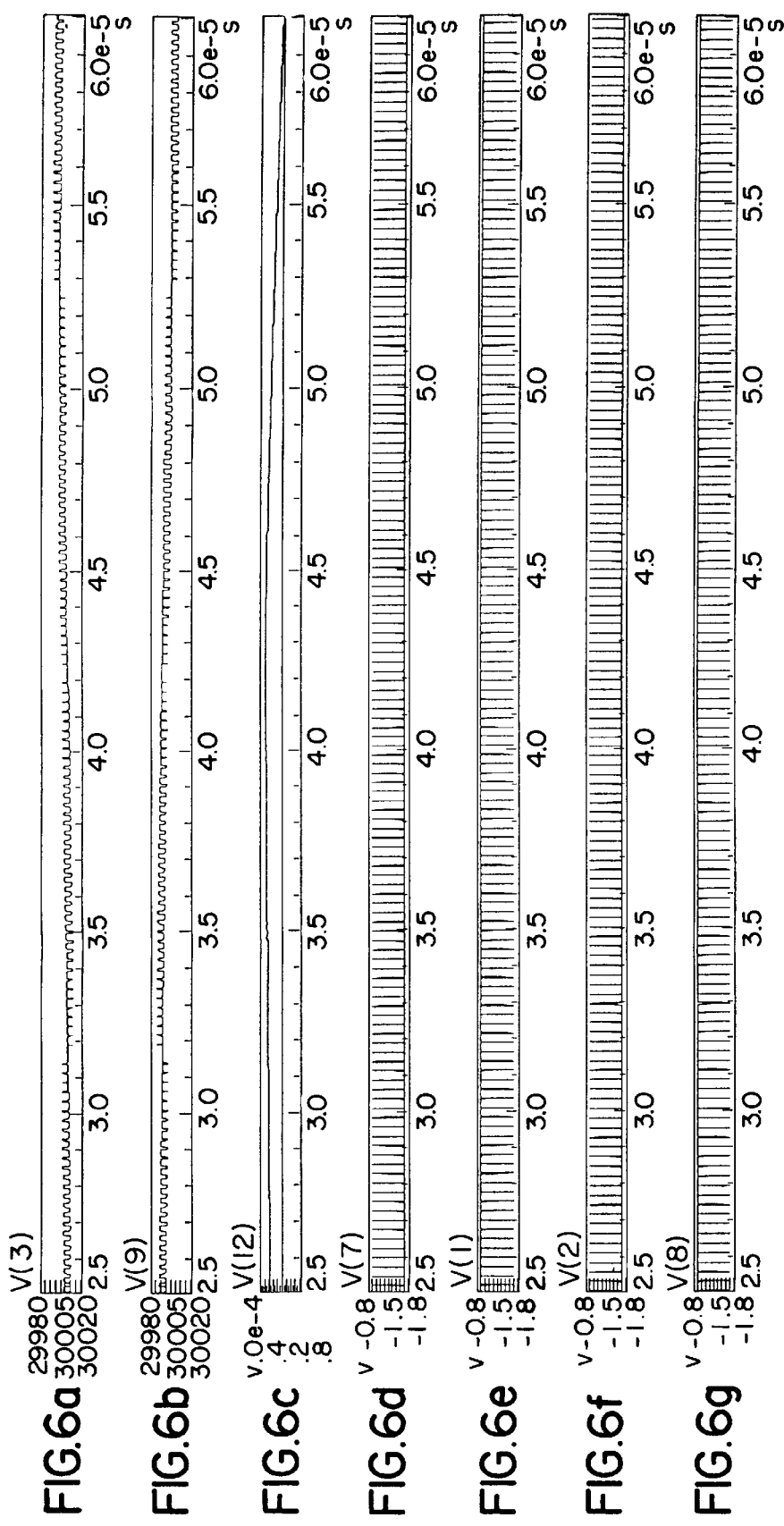

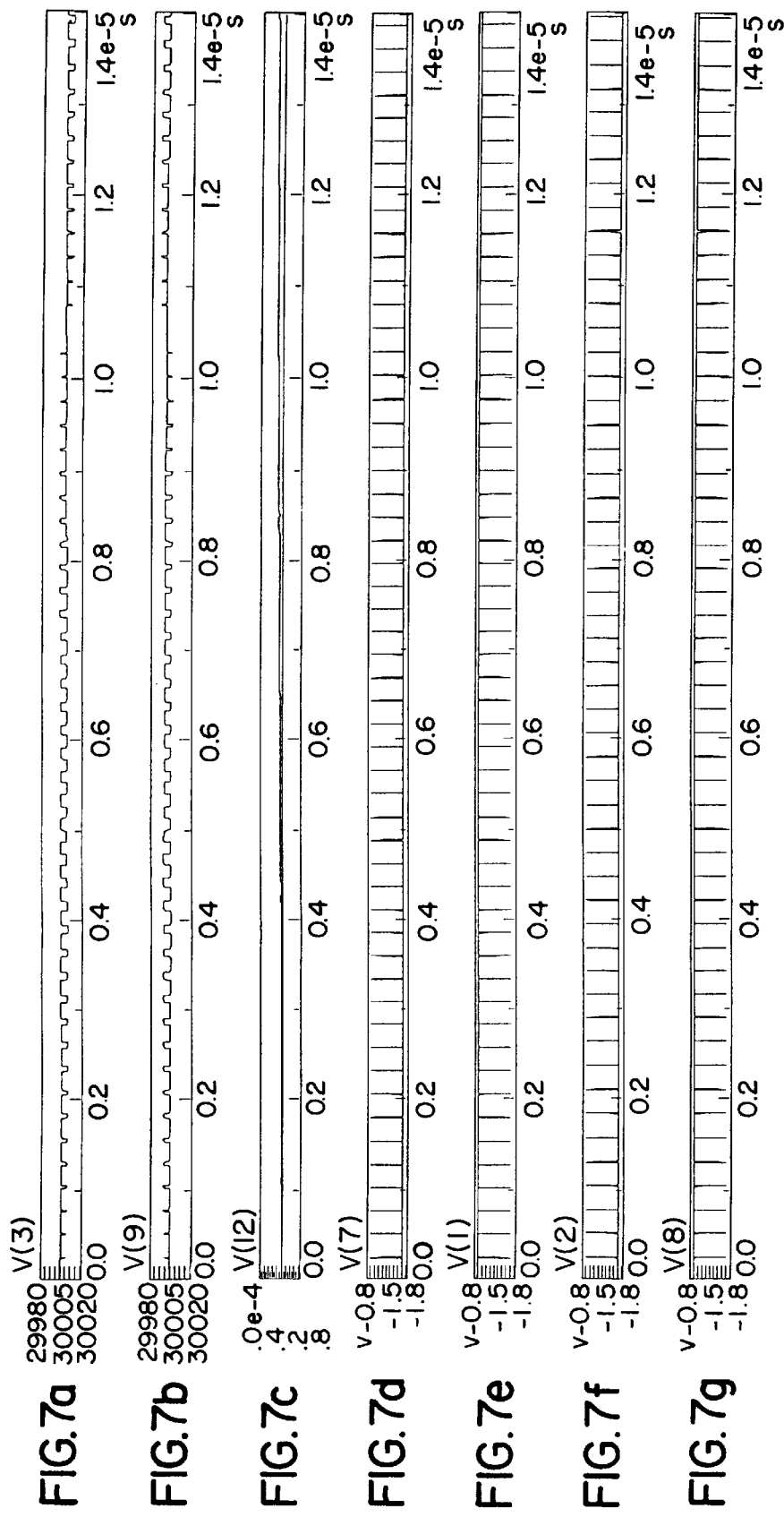

DIRECT DIGITAL PHASE SYNTHESIS

BACKGROUND OF THE INVENTION

1. Field of the Invention

This invention is directed to clock generation circuits, and more particularly to a direct digital phase synthesis circuit and method for generation of a synchronization clock for a telecommunication system.

2. Background Art

In telecommunication systems, the receiver is assumed to be able to generate a set of local clock signals whose phases are identical (except perhaps for a constant offset) to the phases of the signaling alphabet in use at the transmitter. These locally generated signals are compared to the incoming signals in the process of making a maximum likelihood symbol decision. In order to be able to generate these local clock signals, the receiver has to be in synchronization with the received carrier, the beginning of a frame, and the beginning of a symbol of the incoming signal.

For systems using coherent modulation techniques, one direction of communication (such as broadcast channels), or single-link communications (such as most microwave links), the architecture that makes more sense is to make synchronization totally a receiver function. For telecommunication systems that use non-coherent modulation techniques or that involve many users accessing a central communication node, it often makes sense for synchronization to be mostly or entirely a terminal function, with the transmitter assuming a more active role in synchronization. This means that the terminal transmitter parameters are modified rather than modifying the central node's receiver parameters. Synchronization of the system transmitter makes sense with time division multiple access (TDMA) systems, where each user is allocated a segment of time in which to transmit the information, and also with systems that combine signal processing at the central node with frequency division multiple access (FDMA).

In these cases, the transmitter varies the timing and frequency of its transmission to pre-synchronize their transmission with the central node, so that the node can use a fixed set of channel filters and a single timing reference for all channels. Often times, the transmitter relies on a return path from the receiver to determine the accuracy of its synchronization. Without transmitter synchronization, the node will require a separate time and frequency acquisition and tracking capability for each incoming channel, and would need to deal with the possibility of varying amount of adjacent channel interference.

As such, it is known to provide a telecommunication terminal with a master timing generator or a synchronization card, which provides all the above clock signals for synchronization of the receiver and transmitter.

Carrier synchronization is currently obtained using phase locked loops (PLL) which provide an output signal that is of the same frequency and phase with an input signal. As the carrier is a generally a sinusoidal signal, PLLs used for carrier synchronization are analog. The main components of a PLL include a phase detector, a loop filter and a voltage controlled oscillator (VCO), as is well known in the art. The phase detector receives a reference clock extracted from the incoming signal and the local clock, output by the VCO, compares their phases, and provides a control signal for the VCO, which is a measure of the phase difference between these clocks.

For symbol synchronization, the replica generated at the receiver is a square wave at the symbol transition rate. Since there is typically a rather large number of carrier cycles per symbol period, this level of synchronization is much coarser than phase synchronization, and is usually done with other type of circuitry than that used for phase synchronization. Symbol synchronizers can be classified as open loop and closed loop.

In the open loop configurations, the symbol rate is recovered using a combination of filters, a non-linear device, and a high-gain saturated amplifier for shaping the signal to a square wave.

Closed-loop symbol synchronizers use comparative measurements on the incoming signal to bring a locally generated clock signal into synchronism with the incoming data transitions. Among the most popular closed loop symbol synchronizers is the early/late-gate synchronizer, which operates by performing two separate integrations of the incoming signal energy over two different portions of a symbol interval. The early-gate integration begins at the loop's best estimate of the beginning of a symbol period (T) given by the local clock, and integrates over an interval (T-d). The late-gate delays the start of integration for d seconds, and then integrates to the end of the symbol period. The difference between the outputs of these two gates, called the 'up' and 'down' signals, is a measure of the receiver's symbol timing error, and can be fed back to the local clock to correct loop timing. When in lock, the output signal of the local clock has substantially the same frequency and phase as the reference clock.

Frame synchronization involves creating a square wave at the frame rate with the zero-crossing coincident with the transitions from one frame to the next.

Recently, the analog PLLs have been replaced with digital PLLs (DPLL) for symbol and frame synchronization. DPLLs allow lowering loop bandwidth in order to comply with the communication standards. DPLLs also alleviate some of the problems associated with the analog PLLs, such as for example the sensitivity to DC-drift and the need for calibration and periodic adjustment.

A DPLL can use digital logic circuits, or a specialized digital signal processor (DSP). Current DPLLs are of the first type, being based on direct digital frequency synthesis (DDFS) configurations, or they use a digital phase detector and a digital to analog converter (DAC) for controlling the VCO.

When the PLL uses a DAC, a temperature compensated voltage controlled crystal oscillator (TCVCXO) is necessary. This oscillator is manufactured for a specific frequency, which is generally many times higher than the frequency of the common VCOs, and therefore is expensive. The DAC temperature drift should also be compensated for, which complicates the design. Also, the configurations using DACs often present an unsatisfactory control of the phase drift. This results in phase build-up on the VCO output, which demands for additional circuitry for improving the performance of the PLL.

The direct digital frequency synthesis (DDFS) implies eliminating each n-th pulse in an M-pulses sequence of an incoming digital signal, filtering the resultant signal, eliminating the undesired side bands, and extracting the desired frequency. The circuits based on DDFS are provided with a microcontroller and an EEPROM for determining n, M and effecting the deletion. Also, the DDFS algorithm requires complex logic and long acquisition times. Furthermore, if a low frequency off-shelf oscillator, such as for example a temperature compensated crystal oscillator (TCXO), is used in this configuration, an additional analog PLL is necessary for obtaining the desired high frequency, by multiplying the frequency of the local clock.

Yet another disadvantage of the current DDFS is that the clock has rather high jitters, such that another additional analog PLL is generally used for reducing the jitters.

On the other hand, it is advantageous to use specialized digital signal processors (DSPs) which are less expensive than universal microcontrollers and may be integrated with other circuits on the synchronization card. The DSP can provide the additional hardware if a more complex structure of the DPLL is desired for increasing performance, and is not consuming much of the board's real estate. In addition, modification of the circuit parameters is easy when a DSP is used.

An example of a DPLL using a high performance DSP is provided in the paper entitled "Implemenation of a New Type DSP PLL Using High Performance DSP DSSP-1" by Ono et al., IEEE/IECEJ/ASJ International Conference on Acoustics, Speech and Signal Processing, 1986, pp. 2195–2198. The DPLL has linearity in the phase comparison characteristics, gives fast acquisition times and has a wide pull-in range. However, the DPLL proposed in the article has a complex structure, and in addition it employs an analog to digital converter (A/D) and a digital to analog converters (D/A), which are expensive circuits and inherently add noise to the signal. Such complex configurations are not recommendable for clocks operating at very high frequencies.

Another important parameter to consider when designing synchronizers is the cost. Each level of synchronization that is added to a terminal implies an increase in cost, mostly in the area of acquisition and tracking loops which often times involve not only hardware, but also software costs. Additional costs lie in the extra time required to achieve synchronization before commencing communications, in the energy spent by the transmitter on signals to be used at the receiver as acquisition or tracking aids. These costs increase obviously with the transmission rate and the number of transmission channels, where improved performance and versatility are necessary.

There is a need for a synchronizer and method of synchronization which are cost efficient and applicable to a variety of telecommunication terminals.

SUMMARY OF THE INVENTION

It is an object of the present invention to provide a universal synchronizer for use in a variety of telecommunication systems based on direct digital phase synthesis (DDPS). The synchronizer of the invention may be used for wireless, optical, or wireline transmission systems and works well with a wide ranges of data rates. The synchronizer according to the invention may be used for example for SONET line-timing (frame) clock generation, and is adapted to provide SONET minimum clock (SMC) hold-over and free-run capabilities, as well as external timing clocks generation with Stratum 3 hold-over and free-run capabilities.

It is another object of the present invention to provide an inexpensive but reliable synchronizer based on digital and analog PLL configurations. The circuit does not use expensive DACs, or external microcontrollers. Therefore, the synchronizer can be implemented using the existing real estate of logic gates available at the terminal, or can be implemented by way of a stand-alone integrated circuit.

Still another object of the invention is to provide a synchronizer that uses off-shelf components for the local oscillators, that are less expensive than the temperature compensated voltage controlled crystal oscillators (TCVCXO) necessary for the current DAC based configurations.

Accordingly, the invention is directed to a synchronizer for locking a local clock $f_L$, generated with a voltage controlled oscillator (VCXO), to a reference clock, comprising a first digital phase detector for comparing the phase of the local clock $f_L$ with the phase of a first reference clock $f_{R1}$ extracted from a digital signal and providing a first phase error signal $PE_1$, a digital phase synthesis unit for receiving the first phase error signal and a target phase error and producing a first and a second set of control signals, and an error driver for receiving the first set of control signals and generating a control voltage for adjusting the VCXO to lock the synchronizer on the reference clock.

The invention further comprises a digital phase locked loop (DPLL) for locking a local clock $f_L$, generated with a voltage controlled oscillator (VCXO), to a reference clock, comprising a first digital phase detector for comparing the phase of a local clock $f_L$ with the phase of a first reference clock $f_{R1}$ extracted from said incoming signal and providing a first phase error signal $PE_1$; an analog phase detector for comparing the phase of said local clock $f_L$ with the phase of a second reference clock $f_{R2}$ extracted from said incoming signal and providing a second phase error signal $PE_2$; a digital phase synthesis unit for receiving said first and second phase error signals and producing a first and a second pairs of up-down signals for operating said synchronizer in a digital locked mode, and for producing a third pair of up-down signals for operating said synchronizer in one of an acquisition mode and an analog locked mode; a digital error attenuator for receiving said first and second pair of up-down signals and generating a duty cycle control voltage step; an analog error amplifier for receiving said third pair of up-down signals and generating an analog control voltage step; and an integrator for receiving one of said duty cycle control voltage step and said analog control voltage step, and providing a control voltage for adjusting said VCXO to lock said synchronizer on the frequency of said local clock.

The invention also includes a method for synchronizing a digital phase locked loop (DPLL) of a local frequency $f_L$ to a reference signal using direct digital phase synthesis, comprising the steps of comparing, in a first digital phase detector, the phase of a local clock $f_L$ with the phase of a first reference clock $f_{R1}$ extracted from a digital signal and providing a first phase error signal $PE_1$, processing, in a digital phase synthesis unit, the first phase error signal and a target phase error and producing a first and a second set of control signals for operating the synchronizer in one of a digital locked mode and an acquisition mode, respectively; and generating, in an error driver, a control voltage from the first and second sets of control signals for locking the frequency of the local clock $f_L$ to the first reference clock.

Advantageously, the cost of the synchronizer of the invention is significantly reduced by eliminating the DAC and by replacing the TCVCXO with an off-shelf lower frequency VCXO. These improvements reduce the overall cost of the synchronizer by more than 50% in most applications.

Elimination of the DAC also results in a better control of the temperature drift, which is substantially reduced by direct phase measurements. In addition, elimination of the DAC and use of an analog integrator prevent phase build-up on the VCO output, which would otherwise occur due to limited resolution of digital phase detectors.

Use of a programmable on-chip DSP provides for an universal and comprehensive functionality of the synchronizer. The synchronizer accepts TCXOs of any frequency, a wide range of external and line reference frequencies and provides automatic reference frequency switching.

Furthermore, the synchronizer according to the invention uses digital phase detectors (DPD), which have a much better resolution than the conventional phase detectors.

BRIEF DESCRIPTION OF THE DRAWINGS

The foregoing and other objects, features and advantages of the invention will be apparent from the following more particular description of the preferred embodiments, as illustrated in the appended drawings, where:

FIGS. 1A and 1B illustrate block diagrams of prior art digital PLLs;

FIGS. 4a–4g show voltage/time diagrams in various points of circuit of FIG. 3B, for a large difference between the duty cycle of signals UPP/UPN and DNP/DNN;

FIGS. 5a–5g show voltage/time diagrams in various points of circuit of FIG. 3B, for a moderate difference between the duty cycle of signals UPP/UPN and DNP/DNN;

FIGS. 6a–6g show the time diagrams of FIGS. 5a–5g for a zoomed time scale; and

FIGS. 7a–7g show the time diagrams of FIGS. 5a–5g for a further zoomed time scale.

DESCRIPTION OF THE PREFERRED EMBODIMENT

Figure 2A:
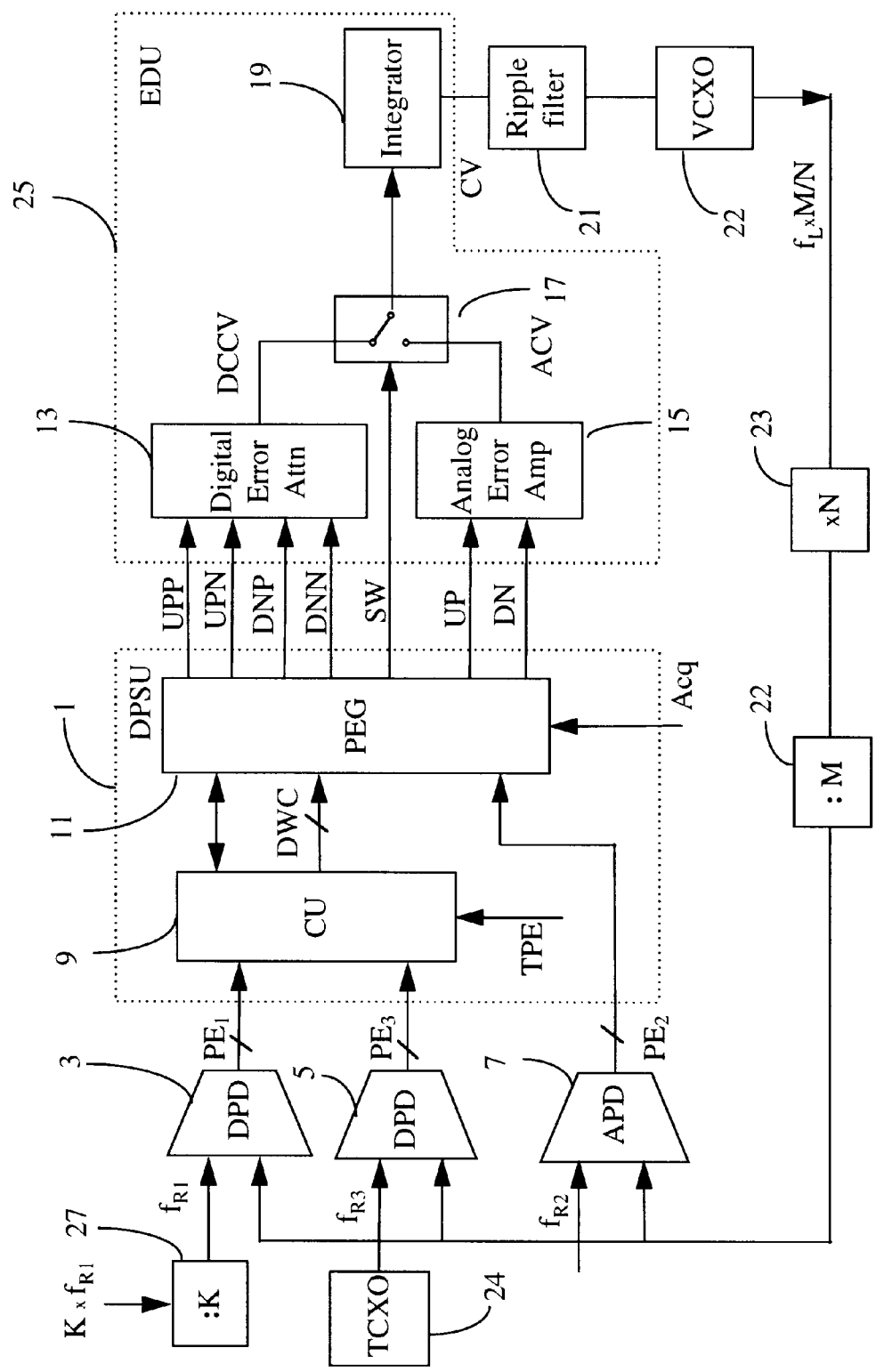
FIG. 2A is a block diagram of the direct digital phase synthesis (DDPS) synchronizer according to the invention.

For correctly recovering the data received over a transmission channel, the receiver should be tuned to the frequency of the clock signal recovered from the incoming data stream. This is called the reference clock and its frequency is denoted in the following with $f_R$. The synchronizer also provides the locked (or local) clock, and its frequency is denoted in the following with $f_L$. In this specification, $f_R$ and $f_L$ will be used to designate the reference and locked signals, and also to designate the respective frequencies.

FIG. 1A illustrates a digital PLL currently used for synchronizing a local oscillator (clock) 12 with a reference signal $f_R$. In the embodiment of FIG. 1A, the local clock 12 is a temperature compensated voltage controlled crystal oscillator (TCVCXO) with a frequency of oscillation in the hundreds of MHz or GHz range. This is an expensive component designed to respond to control voltage steps having a resolution less than one milivolt. The local clock 12 is frequency and phase compared with a reference signal of frequency $f_R$, recovered from the incoming data. The comparison is effected in block 14, which is a digital phase/frequency detector. After the loop is locked on the desired frequency during acquisition mode, the phase error is corrected using the phase error signal (PE), which is a measure of the difference between the phases of the local clock and the reference clock. PE, which is a digital signal, is processed by microcontroller 16, which also includes an EEPROM, to obtain a digital control signal (CS). CS is thereafter converted to an analog control voltage in block 18, which is a DAC/amplifier unit. It is to be understood that both $f_L$ and $f_R$ are obtained by multiplying and dividing the frequency of the respective signals using units 20 and respectively 22, which are dividers in the example of FIG. 1A.

FIG. 1B illustrates another type of PLL currently used for frame synchronization. In this example, the reference frequency $f_{R1}$ is extracted from the incoming data, as in the example of FIG. 1A, and compared with the local frequency $f_L$ in a digital frequency/phase detector 14, the phase error PE being applied to a microcontroller 16. The local oscillator is a voltage controlled crystal oscillator (VCXO) 22, which is less expensive than the TCVCXO 12 of FIG. 1A. The control voltage CV is precisely generated using microcontroller 16, a direct digital phase synthesis circuit (DDFS) 26, an analog phase detector (APD) 28, and a low pass filter (LPF) 30. A temperature controlled crystal oscillator (TCXO) 24 is also used for providing a second reference frequency $f_{R2}$ which is multiplied K times in multiplier 32 before being used as a reference to DFPD 14 for improving the resolution of the PLL. TCXO also provides a stable frequency which is used by DDFS circuit 26 to synthesize frequency $f_S$, used by an analog PLL (APD 28, LPF 30, VCXO 22 and divider 34) for generation of the local clock $f_L$. Units 20, 22, and 32 illustrate dividers/ multipliers for providing a flexible design applicable to various $f_L/f_R$ combinations.

FIG. 2A shows the block diagram of the synchronizer according to this invention. The synchronizer integrates digital and analog phase loops, and operates in a digital acquisition mode, an analog locked mode and a digital locked mode, as determined by a signal Acq. Although three reference signals ($f_{R1}$, $f_{R2}$, and $f_{R3}$) are disclosed and illustrated in FIG. 2A, it is to be understood that more reference signals may be synchronized with the circuit of FIG. 2A, according to the specification of the respective application of the circuit.

Each PLL operates to locking the frequency $f_L$ of the local oscillator VCXO 322 to one of reference frequencies $f_{R1}$, $f_{R2}$, or $f_{R3}$, by comparing the phase of the respective reference signal with the phase of the locked signal in a digital phase detector (DPD) 3 or 5, or in an analog phase detector (APD) 7. Reference signal $f_{R1}$ is phase compared with the locked signal $f_L$ by DPD 3 to obtain phase error signal $PE_1$; reference signal $f_{R2}$ is phase compared with the locked signal $f_L$ by APD 7 to obtain phase error signal $PE_2$; and reference signal $f_{R3}$ is phase compared with the locked signal $f_L$ by DPD 5 to obtain phase error signal $PE_3$. Preferably, the phase errors $PE_1$ and $PE_3$ output by the detectors 3 and 5, respectively are 16-bit digital signals, while $PE_2$ is a 2-bit pulse width modulated signal.

The phase error signals are input to a digital phase synthesis unit (DPSU) 1, which calculates a set of control signals comprising four member signals; an up positive (UPP); an up negative (UPN); a down positive (DNP); and a down negative (DNN). An error driver unit (EDU) 25 receives these signals and calculates the control voltage CV, which is filtered in ripple filter 21 and applied to VCXO 22.

FIG. 2A shows an application where VCXO 22 oscillates at frequency $f_L \times M/N$, which is a multiple (M/N) of the locked frequency $f_L$. A multiplier 23 and a divider 22 are used to obtain a locked signal of a stable frequency $f_L$. FIG. 2A also shows that reference frequency $f_{R1}$ is obtained using a divider 27, and reference frequency $f_{R2}$ is generated by a fixed reference clock TCXO 24, which is for example a stratum-3 SONET clock. It is to be understood that the VCXO used herein is an off-shelf component, K, M and N being selected so as to obtain the necessary value of $f_L$. Of course, an VCXO with an oscillation frequency $f_L$ may be used if available, in which case the multipliers and dividers are not necessary.

DPSU 1 comprises a control unit (CU) 9 which controls the mode of operation of the synchronizer. CU 9 receives phase error signals $PE_1$, and $PE_3$ and generates, for the digital PLL, a density and width code (DWC). DWC is preferably a 16-bit digital signal.

For example, control unit 9 takes 10 measurements of the phase errors $PE_1$ to calculate a DWC. DWC is generated from these measurements, from a target phase error (TPE), and from the transfer functions of a phase error generator circuit (PEG) 11. The value of TPE is calculated using $PE_1$, $PE_3$, and a plurality of provisioned parameters for the respective loop, such as the skew, the loop bandwidth, and resolution.

Besides simultaneous frequency monitoring for DPLLs, the control unit 9 also performs the automatic switching between the port cards A/B and between synchronization modes, lock acquisition for both the analog and digital PLLs, and generation of interrupts for various faulted conditions, which are programmable functions.

DWC is applied to phase error generator 11. PEG 11 generates the 'up' signals UPP and UPN and 'down' signals DNP and DNN. Each of these signals is a stream of pulses with the frequency and width defined by the DWC. As indicated above, DWC is a 16-bit control signal. Preferably, 8 bits of DWC are used for controlling the frequency of the signals UPP, UPN, DNP and DNN, to perform a coarse control of their duty cycle. The remaining 8 bits are preferably used for controlling the width of these signals, to perform a fine control of their duty cycle.

The set of control signals is generated in accordance to the resolution desired for the control voltage (CV) driving VCXO 22. As the frequency and width of the 'up' signals are different from those of the 'down' signals, PEG 11 calculates alternatively these parameters from a corresponding DWC.

Error driver unit 25 comprises a digital error attenuator 13, an analog error attenuator 15, a switch 17 and an integrator 19.

Digital error attenuator 13 determines the difference between the respective UPP, DNN and UPN, DNP signals and provides a duty cycle control voltage (DCCV) step at the input of integrator 19. Switch 17 is operated with a signal SW to connect the input of integrator 19 to one of units 13 or 15, according to the mode of operation of the synchronizer. Switch 17 is provided for reducing the interference from the components of the analog PLL during the digital mode of operation, and the interference from the components of the digital PLL during the analog mode of operation. The DCCV step is then integrated in RC integrator 19 and filtered in filter 21, to obtain the control voltage (CV). CV is applied to VCXO 22 until the TPE is attained. The CV is adjusted by varying the amplitude of the DCCV step, for obtaining the desired resolution of the PLL.

Analog error amplifier 15 is provided for generating the control signal in the acquisition mode and in locked analog mode of operation of the synchronizer. UP and DN signals are generated by PEG 11 based on DWC calculated by the control unit 9 for operation in the acquisition mode, or based on $PE_2$ determined by analog phase detector APD 7 for operation in the acquisition and locked analog mode.

In the acquisition mode of operation, PEG 11 calculates signals UP and DN. To this end, the synchronizer compares the reference frequency of interest with the local frequency $f_L$ generated by VCXO 22, using a corresponding DPD 3, 5, or APD 7, in the known manner. PEG 11 also generates SW signal which positions switch 17 so as to apply an analog control voltage (ACV) step, output by analog error amplifier 15, to the VCXO trough R-C integrator 19 and filter 21. VCXO 22 begins oscillating and it arrives relatively fast at the loop frequency $f_L$.

In the locked digital mode of operation, such as when locking the 8 kHz SONET frame, DPD 3 receives the reference signal $f_{R1}$, which is the recovered frame clock in the example of FIG. 2A, and the local clock $f_L$ from VCXO 22. Whenever available, the fixed reference clock TCXO 24, (Stratum-3 SONET clock) of frequency $f_{R3}$, is also compared with the local clock $f_L$ in the second DPD 5. The phase error signal $PE_1$, proportional with the phase difference between $f_{R1}$ and $f_L$ and the phase error signal $PE_3$, proportional with the phase difference between $f_{R3}$ and $f_L$, are applied to DPSU 1. DCCV step is applied to the input of integrator 19, and the resulting control voltage CV is then applied to VCXO 22, after it was filtered in filter 21.

The DCCV step is generated until the phase error measured between VCXO and TCXO clocks attains TPE. After TPE has been attained, CV, and accordingly the phase of VCXO clock, oscillate around the target value to compensate for any undesired deviation of the loop lock, until a new TPE is calculated.

In the locked analog mode, an analog PLL is used including analog phase detector APD 7, PEG 11, analog error amplifier 15, switch 17, integrator 19, filter unit 21, and local clock VCXO 22. The phases of clocks, $f_{R2}$ and $f_L$ are compared in APD 7, the output of the APD 7 being a pulse width modulated (PWM) stream carrying information on the phase error $PE_2$. The PWM stream is applied to PEG 11 which provides signals UP and DN to unit 15, which drives integrator 19 with the ACV step, to provide the control voltage for VCXO 22.

FIG. 2A shows an embodiment of the invention comprising digital and analog PLLs, that may be used for clock generation in SONET receivers/transmitters, but it should be understood that the invention may also be used in over 80% of clock generation circuits for synchronous telecommunications. This includes fiber and wireless transmitters and receivers.

The synchronizer shown in FIG. 2A provides one of the following choices for the loop frequency, according to the reference signal used:

1. DPSU implements a DPLL for hold-over and free-run synchronization modes. Hold-over mode of operation implies upholding the previous value for the locked frequency $f_L$ when the reference signal fails, and free-run provides for a TCXO-based midpoint value of VCXO frequency $f_L$, when the input reference clock $f_R$ deviates gradually without abrupt failure into an out-of-lock condition.

2. The SONET frame synchronization mode. Reference frequency $f_{R1}$ is obtained from the S1 bytes recovered by the overhead processor. A digital PLL with a 0–3 Hz bandwidth is used for this 8 kHz frequency. 3. The SONET symbol synchronization mode. Reference frequency $f_{R2}$ is obtained from an external clock, which can be provided for example by ESIA/B coming from other sources such as the building integrated timing supply (BITS). An analog PLL with a 32–1000 Hz bandwidth can be used for this multi MHz frequency. 4. An A/B slave synchronization signal is generated in the 'slave mode' when $f_{R2}$ is obtained from the pair port card B/A, and is provided in the case of protection switching. An analog PLL with typical 0.5–2 kHz bandwidth can be used for this multi MHz frequency.

Switching between A/B references and between the above synchronization modes is performed automatically by the control unit.

Figure 2B:
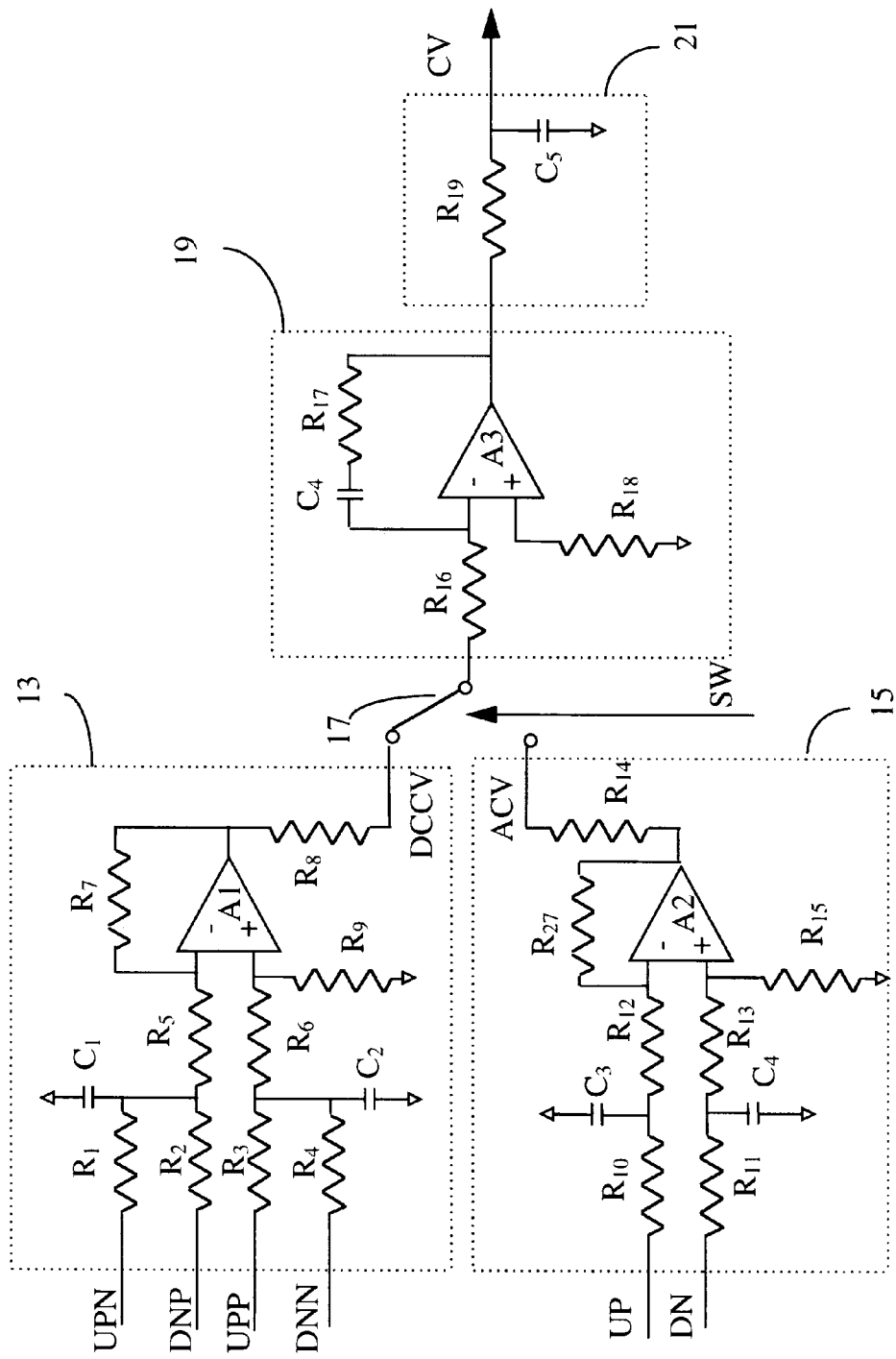
FIG. 2B is a schematic of digital error attenuator, analog error amplifier, integrator and filter shown in FIG. 2A.

FIG. 2B illustrates an embodiment of the schematic diagram of digital error attenuator 13, analog error amplifier 15, integrator 19 and filter unit 21.

UPN and DNP digital signals are applied on the negative input of a differential amplifier A1, while UPP and DNN are applied on the positive input. Each of these signals is filtered for eliminating frequencies above 100 Hz. Thus, signal UPN is filtered using resistors R1, R5, and capacitor C1; DNP is filtered by resistors R2, R5, and capacitor C1, while signals UPP and DNN are filtered using resistors R3/R4 and R6 and capacitor C2. The relative values of the resistors R5, R6, R7, R8 and R9 are selected such as to obtain a desired amplitude for DCCV. In the example of FIG. 2B, A1 is used as an attenuator (1/12). In this way, the resolution of the digital PLL is improved by reducing the minimum control voltage (CV), the offset errors and the noise level of CV.

When the synchronizer operates in the digital mode, switch 17 is positioned by signal SW such that DCCV step is collected from R8 and applied at the input of integrator 19. Integrator 19 comprises an operational amplifier A3, provided with an integrating R-C circuit formed by capacitor C4 and resistor R17. The value of resistors R16–R17 is selected to obtain an attenuation of 16.

The signal at the output of amplifier A3 is then filtered by ripple filter 21 comprised of resistor R19 and capacitor C5, to eliminate frequencies over 50 kHz. Control voltage CV is obtained at the output of this filter.

The analog error amplifier 15 receives the UP and DN signals. These signals are filtered by R10, R12, C3 and R11, R13 and C4, respectively, and then applied to a differential amplifier A2 for comparison. A2 amplifies the ACV step signal (e.g. 10 times) and applies it to the input of integrator 19 when switch 17 connects R14 to R16. CV is obtained as in the case of the digital mode of operation, after the integrated output of analog error amplifier 15 is filtered in ripple filter 21.

Figure 3A:
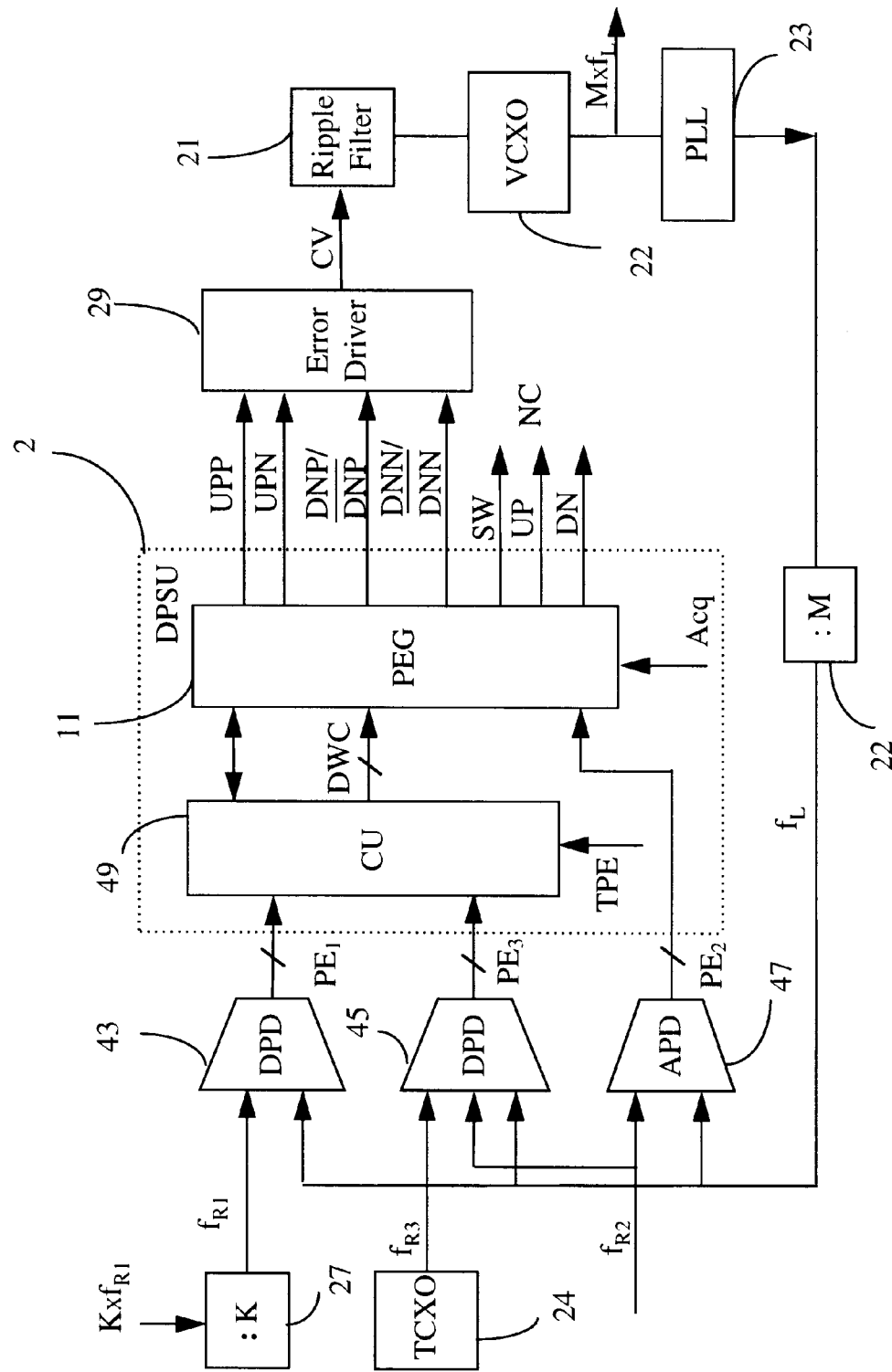
FIG. 3A is a schematic of another embodiment of the DDPS synchronizer.

FIG. 3A shows another embodiment of the synchronizer according to the invention using an error driver 29 where switch 17 has been eliminated, and digital error attenuator 13, analog error amplifier 15 and integrator 19 were combined into a simpler circuit.

The components count for error driver 29 is reduced with two operational amplifiers and a number of discrete components. Therefore, this variant costs less than the previous one, and presents improved reliability, in exchange to an insignificant compromise in quality of the recovered clock, which is still acceptable for 90% of the applications.

The digital mode of operation involves digital phase detectors 43 and respectively 45, which compare the phase of the respective reference signal $f_{R1}$ or $f_{R3}$ with the phase of the loop frequency $f_L$ to provide the respective phase error signals $PE_1$ or $PE_3$. The phase error signals $PE_1$ and $PE_3$ are applied to a control unit 49 (a DSP), to provide the density width code (DWC). PEG 11 generates a first set of control signals UPP, DNN, UPN, and DNP, during the digital locked mode, and generates a second set of control signals UPP, $\overline{DNN}$, UPN, and $\overline{DNP}$ during the analog locked and acquisition modes. These sets are applied to error driver 29 to obtain the CV. CV is filtered in the ripple filter 21, and is applied to VCXO 22 for locking the frequency of oscillation $f_L$ in the known way.

In this embodiment UP, DN signals are not connected as in the embodiment of FIG. 2A. Rather, as higher gains are necessary for operation in the acquisition mode and locked analog PLL modes, the phase error generator 11 gates the inverted values $\overline{DNN}$ and $\overline{DNP}$ into the 'down' signals DNN, DNP. As a result of this inversion, UPP and DNN are added to each other, and UPN and DNP are also added to each other during these modes of operation, instead of being subtracted.

Figure 3B:
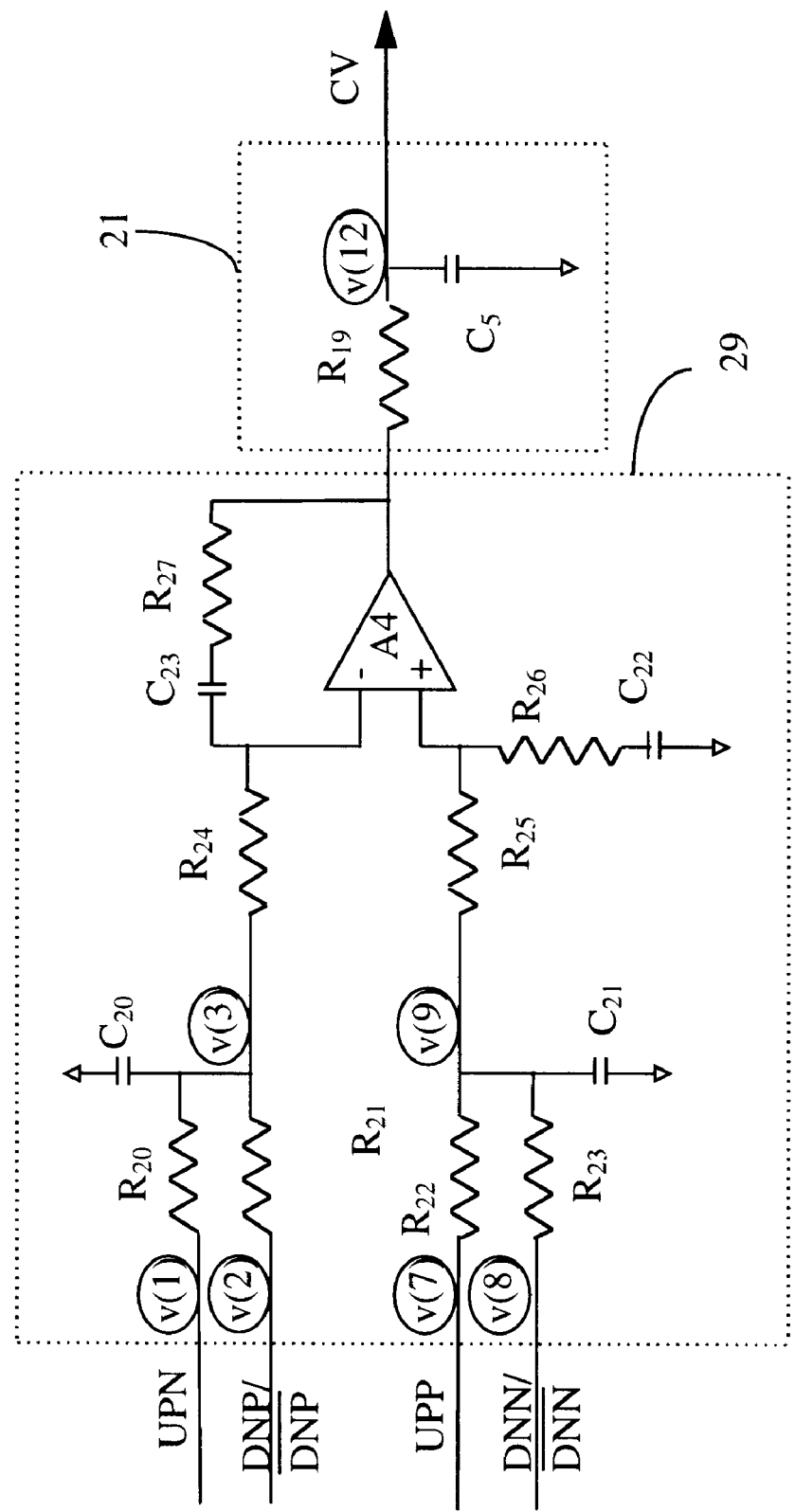
FIG. 3B is a schematic of the error driver unit, integrator and filter shown in FIG. 3A.

FIG. 3B shows the schematic of error driver 29. The error driver is designed as a mostly passive network in this embodiment, with only one operational amplifier. For UPN and DNP, each resistors R20, R21 forms a filter with capacitor C20, which eliminates frequency components above 10 kHz. Similarly, for UPP and DNN, each resistor R22, R23 forms a filter with capacitor C21, which eliminates frequency components above 10 kHz. A differential amplifier A4 is connected such as to attenuate the difference between the signals on its inputs by ⅓, for locked digital mode, and by ⅔ for the acquisition and locked analog modes, so that the control voltage CV at the output of error driver 29 can be directly applied to VCXO 22. As indicated above, pairs UPP- $\overline{DNN}$ and UPN- $\overline{DNP}$ are used during acquisition and analog locked modes of operation of the circuit.

Operational amplifier A4 also integrates the difference, as shown by the R-C circuit made of C23 and R27. Ripple filter 21 comprises, as in the previous embodiment, R19 and C5.

The mode of operation of the synchronizer of FIG. 3A is generally similar to that of the embodiment of FIG. 2A, and is explained next in connection with FIGS. 4–6. These figures illustrate time diagrams for the signals measured in the points marked with v(1), v(2), v(7), v(8), v(3), v(9), and v(12) on the schematic of FIG. 3B.

The values for the components on FIG. 3B were selected as follows: R20 to R25=10 kohm; R26 and R27=5 kohm; R19=100 ohm; C20 and C21=3.9 nF; C22=C23=8 $\mu$F; and C5=100 nF.

FIGS. 4a–4g show time diagrams in the above-mentioned points for the case of a large difference between the duty cycle of signals 'up' (UPP, UPN) and 'down' (DNP, DNN), as is the case during transitions of the loop. During the simulation, the duty cycle of the signals v(3) and v(9) was increased by increasing the frequency of DNP, DNN versus the frequency of UPP, UPN pulses. The intervals marked on the time axis are at $0.1 \times e^{-6}$ seconds, for better showing how the pulses are added and subtracted.

It can be seen that the pulses v(7) and v(1) illustrated in FIGS. 4d and 4e, respectively, are complementary to each other; these are signals UPP and UPN. Similarly, pulses v(2) on FIG. 4f are complementary with pulses v(8) shown in FIG. 4g; these are DNP and DNN. As shown in the schematic of FIG. 3B, signal UPN is added with signal DNP on resistors R20 and R21, so that the signal v(3) at the negative input of A4 looks as shown in FIG. 4a. Thus, voltage v(3) is high as long as v(1) is high and goes low when v(1) goes low, as shown by arrow A1. v(3) returns to high when v(2) goes high, as shown by arrow B1. Next transitions of v(3) to low and back to high, are illustrated by arrows A2-B2 and A3-B3, respectively. FIG. 4b shows signal v(9) which is applied on the positive input of differential amplifier A4 of FIG. 3B. Arrow C1 illustrates the first transition of signal v(9) from low to high, when v(7) goes from low to high, while arrow D1 shows the transition of v(9) from high back to low, when v(8) transits from high to low. Arrows C2-D2 and C3-D3 show the respective following transitions of the signal v(9).

As discussed above, v(12), which is shown in FIG. 4c and is the control voltage for the loop oscillator 422, is obtained after the difference between the inverted v(3) and v(9) is integrated. It can be seen on FIGS. 4a and 4b that the period of time while inverted v(3) and v(9) are high increases in time, such that the interval during which these pulses are low, respectively high, increases linearly. As a result, v(12), which is CV, increases slightly as shown in FIG. 4c, which in turn changes the phase of the locked signal $f_L$, to reduce the phase error.

FIGS. 5a–5g show the DPLL in a locked condition, where the loop frequency $f_L$ varies around the target value TPE.

The measurements were effected on the circuit shown in FIG. 3A for the same values of the components. It is to be noted that time is marked on the scale axis at intervals of $0.2 \times e^{-6}$ seconds, for better illustrating how signal CV varies around the target value. It can also be seen on this figure how v(3) and v(9) oscillate around a respective value which varies in time with opposed phase.

FIGS. 6a–6g and FIGS. 7a–7g show the time diagrams of FIGS. 5a–5g for a zoomed time scale to show signals v(3) and v(9) more clearly, and also to show how the width of these pulses varies in time.

While the invention has been described with reference to particular example embodiments, further modifications and improvements which will occur to those skilled in the art, may be made within the purview of the appended claims, without departing from the scope of the invention in its broader aspect.

I claim:

1. A synchronizer for locking a local clock generated with a voltage controlled oscillator (VCXO), to a first reference signal from an incoming digital signal, comprising:

a first digital phase detector for comparing the phase of said local clock with a phase of the first reference signal and for providing a first phase error signal;

a digital phase synthesis unit for receiving said first phase error signal and a target phase error and producing a first set of control signals; and an error driver for generating a control voltage from said first set of control signals for adjusting said VCXO to lock said synchronizer with said reference clock.

2. A synchronizer as claimed in claim 1, further comprising an analog phase detector for comparing the phase of said local clock with the phase of a second reference clock extracted from an analog signal and for providing a second phase error signal to said digital phase synthesis unit; and wherein said digital phase synthesis unit includes circuitry to produce said first set of control signals from the second phase error.

3. A synchronizer as claimed in claim 1, further comprising a second digital phase detector for comparing the phase of said local clock with a phase of a fixed reference clock and for providing a third phase error signal to said digital phase synthesis unit; and wherein said digital phase synthesis unit includes circuitry to produce said first set of control signals with third phase error signal.

4. A synchronizer as claimed in claim 2, wherein said digital phase synthesis unit comprises:

a control unit for receiving said first phase error signal and said phase error target and for generating a density and width code (DWC) carrying information on a target frequency and width of each member of said first and second set of control signals; and a phase error generator for receiving said DWC, an acquisition signal, and said second phase error signal, for producing said first set of control signals for operation in a digital locked mode, and for producing a second set of control signals for operation in an analog locked mode and in an acquisition mode.

5. A synchronizer as claimed in claim 4, wherein said control unit includes a digital signal processor.

6. A synchronizer as claimed in claim 2, wherein:

said first set of control signals comprises an up positive, a down negative, an up negative, and a down positive signal; and said second set of control signals comprises an up positive (UPP), an inverted down negative (non-DNN), an up negative (UPN), and an inverted down positive (non-DNP) signal.

7. A synchronizer as claimed in claim 6, wherein said error driver comprises:

an operation amplifier attenuator, having a first and second input and an output providing said control voltage;

a first adder for summing said UPN signal with one of said DNP and non-DNP signal to obtain a first sum that is sent to the first input of said operation amplifier attenuator;

a second adder for summing said UPP signal with one of said DNN and said non-DNN signal to obtain a second sum that is sent to the second input of said operational amplifier; and an integrating circuit connected between said first input and said output of said operation amplifier attenuator for first and said second sum.

8. A synchronizer for locking a local clock $f_L$, generated with a voltage controlled oscillator (VCXO), to a reference clock, comprising:

a first digital phase detector for comparing the phase of a local clock $f_L$ with the phase of a first reference clock $f_{R2}$ extracted from said incoming signal and providing a first phase error signal $PE_1$;

an analog phase detector for comparing the phase of said local clock $f_L$ with the phase of a second reference clock $f_{R2}$ extracted from said incoming signal and providing a second phase error signal $PE_2$;

a digital phase synthesis unit for receiving said first and second phase error signals and producing a first and a second pairs of up-down signals for operating said synchronizer in a digital locked mode, and for producing a third pair of up-down signals for operating said synchronizer in one of an acquisition mode and an analog locked mode;

a digital error attenuator for receiving said first and second pair of up-down signals and generating a duty cycle control voltage step;

an analog error amplifier for receiving said third pair of up-down signals and generating an analog control voltage step; and an integrator for receiving one of said duty cycle control voltage step and said analog control voltage step, and providing a control voltage for adjusting said VCXO to lock said synchronizer on the frequency of said local clock.

9. A synchronizer as claimed in claim 8, further comprising a switch for selecting one of said duty cycle control voltage step and said analog control voltage step from the output of said respective digital error attenuator and said analog error amplifier according to the mode of operation of said synchronizer.

10. A synchronizer as claimed in claim 8, wherein said digital error attenuator comprises:

a first operational amplifier connected as an attenuator, having a first and a second input and an output for providing said duty cycle control voltage step;

a first adding circuit for receiving said first up-down pair and applying the sum of the members of said first pair to the first input of said operational amplifier; and a second adding circuit for receiving said second up-down pair and applying the sum of the members of said second pair to the second input of said operational amplifier.

11. A synchronizer as claimed in claim 8, wherein said analog error amplifier comprises a second operational amplifier, for receiving a member of said third pair of up-down signals on each of a first and a second input and for providing said analog control voltage step on the output.

12. A DDPS as claimed in claim 8, wherein said integrator comprises:

a third operational amplifier having a first and a second input and an output for receiving said duty cycle control voltage step on said first input and a bias voltage on said second input; and an integrating circuit connected between said first input and said output, for integrating said duty cycle control voltage step to obtain said control voltage.

13. A method for synchronizing a digital phase locked loop (DPLL) of a local frequency $f_L$ to a reference signal using direct digital phase synthesis, comprising the steps of:

comparing, in a first digital phase detector, the phase of a local clock $f_L$ with the phase of a first reference clock $f_{R1}$ extracted from a digital signal and providing a first phase error signal $PE_1$;

processing, in a digital phase synthesis unit, said first phase error signal and a target phase error and producing a first and a second set of control signals for operating said synchronizer in one of a digital locked mode and an acquisition mode, respectively; and generating, in an error driver, a control voltage from said first and second sets of control signals for locking the frequency of said local clock $f_L$ to said first reference clock.

14. A method as claimed in claim 13, further comprising the steps of:

comparing, in an analog phase detector, the phase of said local clock $f_L$ with the phase of a second reference clock $f_{R2}$ extracted from an analog signal; and providing a second phase error signal $PE_2$ to said digital phase synthesis unit for producing a first and a second set of control signals.

15. A method as claimed in claim 13, wherein said step of processing comprises:

generating, in a control unit, a density and width code (DWC), from said first phase error and a target phase error;

producing, in a phase error generator, said first and said second set of control signals; and controlling the frequency and width of the pulses of each signal of said first and second set of control signals with said DWC.

16. A method as claimed in claim 15, wherein said DWC is a multi-bit digital signal, a first group of bits being used to control the frequency of pulses of each signal of said first and second set of control signals, a second group of bits being used to control the width of pulses of each signal of said first and second set of control signals.

17. A method as claimed in claim 14, wherein said first set of control signals comprises an up positive (UPP), a down negative (DNN), an up negative (UPN), and a down positive (DNP) signal; and said second set of control signals comprises an up positive (UPP), an inverted down negative (non-DNN), an up negative (UPN), and an inverted down positive (non-DNP) signal.

18. A method as claimed in claim 17, wherein said step of controlling comprises alternatively controlling the frequency and the width of said UPP, UPN signals and said DNP, DNN signals during the locked digital mode; and alternatively controlling the frequency and the width of said UPP, UPN signals and non-DNP, non-DNN signals during the locked analog mode and the acquisition mode.

19. A method as claimed in claim 15, wherein said step of generating a DWC comprises:

providing a transfer function of said phase error generator, and a transfer function of said error driver;

calculating said target phase error from said first and second phase error and a plurality of operational parameters of said synchronizer; and continuously generating said DWC based on said transfer functions, and said target phase error.

20. A method as claimed in claim 17, wherein said step of generating said control voltage comprises:

adding said UPP and DNN signals to obtain a first sum;

adding said UPN and DNP signals to obtain a second sum;

determining the difference between said first and second sums;

integrating said difference for obtaining said control voltage for operation in said digital locked modes.

21. A method as claimed in claim 17, wherein said step of generating said control voltage comprises:

adding said UPP and non-DNN signals to obtain a first sum;

adding said UPN and non-DNP signals to obtain a second sum;

determining the difference between said first and second sums; and integrating said difference for obtaining said control voltage for operation in said locked analog mode and said acquisition mode.

22. A method as claimed in claim 13 further comprising the step of comparing, in a third digital phase detector, the phase of said local clock with the phase of a third fixed reference clock $f_{R3}$ and providing a third phase error signal $PE_3$; and processing said third phase error signal in said digital phase synthesis unit for producing said first and second set of control signals.

* * * * *